United States Patent
Yamamoto et al.

(10) Patent No.: US 7,202,690 B2
(45) Date of Patent: Apr. 10, 2007

(54) SUBSTRATE INSPECTION DEVICE AND SUBSTRATE INSPECTING METHOD

(75) Inventors: Masami Yamamoto, Kyoto (JP); Yoshio Tsuji, Kyoto (JP)

(73) Assignee: Nidec-Read Corporation, Kyoto-shi (JP)

( * ) Notice: Subject to any disclaimer, the term of this patent is extended or adjusted under 35 U.S.C. 154(b) by 0 days.

(21) Appl. No.: 11/182,017

(22) Filed: Jul. 15, 2005

(65) Prior Publication Data

US 2006/0017452 A1     Jan. 26, 2006

Related U.S. Application Data

(60) Continuation-in-part of application No. 10/918,425, filed on Aug. 16, 2004, which is a division of application No. 10/076,458, filed on Feb. 19, 2002, now Pat. No. 6,777,949.

(30) Foreign Application Priority Data

| | | |
|---|---|---|
| Feb. 19, 2001 | (JP) | ................................. 2001-42356 |
| Apr. 10, 2001 | (JP) | ............................... 2001-111132 |
| Apr. 10, 2001 | (JP) | ............................... 2001-111133 |
| Jul. 16, 2004 | (JP) | ............................... 2004-209583 |

(51) Int. Cl.
*G01R 31/00* (2006.01)
*G01R 31/305* (2006.01)
*G01R 31/302* (2006.01)
*G01R 31/02* (2006.01)

(52) U.S. Cl. ........................ 324/763; 324/501; 324/751; 324/752

(58) Field of Classification Search ................ 324/501, 324/751, 752, 763
See application file for complete search history.

(56) References Cited

U.S. PATENT DOCUMENTS

| | | | |
|---|---|---|---|
| 4,578,279 A | 3/1986 | Zingher | ......................... 427/10 |
| 4,967,152 A | 10/1990 | Patterson | ...................... 324/752 |
| 5,517,110 A | 5/1996 | Soiferman | ................ 324/168.1 |
| 5,781,017 A | 7/1998 | Cole, Jr. et al. | ............. 324/751 |
| 5,999,005 A | 12/1999 | Fujii et al. | ................... 324/750 |
| 6,369,590 B1 | 4/2002 | Cugini et al. | ................ 324/752 |

(Continued)

FOREIGN PATENT DOCUMENTS

EP     0 264 481 A     4/1988

(Continued)

*Primary Examiner*—Andrew H. Hirshfeld
*Assistant Examiner*—Timothy J Dole
(74) *Attorney, Agent, or Firm*—Smith Patent Office

(57) ABSTRACT

A laser beam irradiation unit irradiates a laser beam on a top surface pattern portion of a wiring to be inspected among plural wirings formed on a substrate, with an intensity high enough to cause laser abrasion or two-photon absorption at the irradiated portion. A D.C. power supply applies, via an ammeter, a predetermined voltage between an electrode portion that traps electrons released from the top surface portion and a contact prove pressed against a bottom surface pattern of the wiring. An open circuit state and a short-circuit state of the wiring are judged using a current value measured in the ammeter. It is thus possible to inspect a wiring for an open circuit and a short-circuit easily without bringing a probe into contact with the lands of wirings on a top surface of the substrate to be inspected.

21 Claims, 12 Drawing Sheets

U.S. PATENT DOCUMENTS

| | | |
|---|---|---|
| 6,369,591 B1 | 4/2002 | Cugini et al. .............. 324/752 |
| 6,400,165 B1 * | 6/2002 | Knox et al. ................ 324/752 |
| 6,777,949 B2 | 8/2004 | Tsuji et al. ................ 324/501 |
| 6,980,010 B2 * | 12/2005 | Tonouchi et al. .......... 324/750 |

FOREIGN PATENT DOCUMENTS

| | | |
|---|---|---|
| EP | 0 424 270 A | 4/1991 |
| EP | 1 022 573 A | 7/2000 |
| EP | 1 109 029 A | 6/2001 |
| JP | 8-278342 A | 10/1996 |
| JP | 3080158 B | 6/2000 |
| JP | 2002-318258 A | 10/2002 |

\* cited by examiner

FIG.11

| INTENSITY OF LASER BEAM (kW/cm²) | CURRENT VALUE (mA) | | | WAVELENGTH λ (nm) | |
|---|---|---|---|---|---|
| | E=100V | E=200V | E=400V | λ=266 | λ>355 |
| 6 | 0.08 | 0.11 | 0.12 | PHOTO-ELECTRIC EFFECT | (NO PHOTO-ELECTRIC EFFECT) |
| 10 | 0.1 | 0.12 | 0.2 | | |
| 18 | 0.2 | 0.23 | 0.3 | | |
| 27 | 0.56 | 0.8 | 1 | | |
| 37 | 1.4 | 2.48 | 3 | | LASER ABLATION |
| 51 | 3.3 | 6 | 8.8 | LASER ABLATION | |
| 66 | 5.4 | 7.8 | 10.4 | | |
| 80 | 6.2 | 7.6 | 13.6 | | |

SUBSTRATE INSPECTION DEVICE AND SUBSTRATE INSPECTING METHOD

CROSS REFERENCE TO RELATED APPLICATIONS

This application is a continuation-in-part application of U.S. patent application Ser. No. 10/918,425 filed on Aug. 16, 2004, currently pending, which is a divisional application of U.S. patent application Ser. No. 10/076,458 filed on Feb. 19, 2002, now U.S. Pat. No. 6,777,949. These prior applications are incorporated herein by reference.

BACKGROUND OF THE INVENTION

1. Field of the Invention

The present invention relates to a substrate inspection device and a substrate inspecting method for inspecting discontinue or open-circuit state and a short-circuit state of wirings formed on a substrate by selecting a wiring one by one from the plural wirings formed on the substrate subject to inspection, and by detecting a value of a current flowing through the selected wiring or a wiring adjacent to the selected wiring. The invention is applicable to an inspection of electrical wirings on various substrates, including a printed circuit board, a flexible circuit film, a multi-layer wiring board, an electrode plate used in a liquid crystal display or a plasma display device, and a packaging substrate or a film carrier used in a semiconductor package. Hereinafter, these various wiring boards are collectively referred to as the substrates.

2. Related Art

Many types of substrate inspection devices have been provided to examine whether wirings or wirings on a substrate are formed exactly as designed. In particular, as electric and electronic devices are made smaller in size in recent years, the wirings on a substrate used in such a device is required to be fine and to be arranged at high density, and lands of the wirings used as inspection points are increasing in number while decreasing in width. This makes it difficult to conduct an inspection of wirings for a open or a short-circuit by bringing probes of the inspection device into direct contact with all the inspection points on the lands or wirings. To solve this problem, there is proposed a substrate inspection device that inspects wirings for a open or a short-circuit without contact of probes with the lands or wirings.

For example, a substrate inspection device that uses electrons generated by irradiating laser beams onto the lands has been proposed in U.S. Pat. No. 6,777,949 of which disclosure is incorporated herein by reference. The patent discloses an embodiment that inspects the substrate using a current produced by irradiating a laser beam in the UV range to one end of a wiring subject to inspection, and by trapping by a plus electrode electrons released from the irradiated one end of the wiring due to the photo-electric effect.

The device described in the patent enables the inspection of wirings for a open or a short-circuit without contact of the probe to the lands on one side of the substrate. However, because this device makes use of the photo-electric effect, the wavelength of a laser beam to be irradiated is limited up to a specific value (referred to as the threshold wavelength), which may possibly increase the manufacturing costs of the substrate inspection device. In addition, because the threshold wavelength varies with materials (gold copper, etc.) forming the wirings (lands), the wavelength of a laser beam to be irradiated needs to cover the materials forming the lands or wirings, resulting in limitation of the laser beam to be used.

SUMMARY OF THE INVENTION

An object of the invention is to provide a non-contact type substrate inspection device and a substrate inspecting method capable of inspecting wirings for an open or a short-circuit.

Another object of the present invention is to provide a non-contact type substrate inspection device and a substrate inspecting method which utilizes laser beam for emitting electric particles without disadvantage of above mentioned prior art.

A substrate inspection device according to an aspect of the invention examines plural wirings formed on a substrate subject to inspection to determine conformance to standards in terms of electrical property depending on whether two inspection points are conducting. The substrate inspection device comprises a laser beam irradiation section that irradiates a laser beam onto a first inspection point on a wiring at intensity high enough to cause charged particles to be released by laser ablation or two-photon absorption; an electrode that traps the charged particles released from the first inspection point; a voltage apply section that applies a voltage of a predetermined magnitude between the electrode portion and a second inspection point; and a current detection section that is connected to the voltage apply section in series and detects a value of an current caused by the charged particles trapped by the electrode.

According to the device, the laser beam irradiation section irradiates a laser beam onto the first inspection point on the wiring at intensity high enough to cause charged particles such as electrons to be released by laser ablation or two photon absorption, and sufficient amount of charged particles are thereby released by laser ablation or two-photon absorption with less limitation to the wavelength of the laser beam. Because the voltage apply section applies a voltage of a predetermined magnitude between the electrode portion and the second inspection point in this instance, the electrode portion traps the charged particles released from the first inspection point. The charged particles trapped in the electrode portion give rise to a current that flows between the first inspection point and the second inspection point, and the current detection section detects a value of this current.

In the case of judgment as to an open state, a continuity defect (the occurrence of open or discontinuity of a wiring) is judged to be present when a current flowing between the first inspection point and the second inspection point on the single wiring selected among plural wirings is smaller than a pre-set specific value. Meanwhile, in the case of judgment as to a short-circuit state, a short-circuit defect (the occurrence of a short-circuit between two wirings) is judged to be present when a current flowing between the first inspection point on a single wiring selected among plural wirings and the second inspection point on a wiring adjacent to the selected single wiring is larger than a pre-set specific value.

Because the conformity to standards in terms of electrical property is determined using charged particles released by laser ablation or two-photon absorption, the wavelength of a laser beam to be irradiated is least limited. It is thus possible to inspect the wiring for an open or a short-circuit easily.

A substrate inspection device according to an aspect of an embodiment of the invention includes an intensity setting section that sets intensity of the laser beam irradiated from the laser beam irradiation section.

According to that aspect, because the intensity setting section sets the intensity of a laser beam irradiated from the laser beam irradiation section, it is possible to set adequate intensity needed for laser ablation or two-photon absorption to occur. For example, when a high degree of inspection accuracy is required, the intensity of a laser beam to be irradiated is set to a maximum value at the upper limit not to cause damages on the substrate or its wirings to be inspected conversely, when damages on the substrate are limited to the least, it is possible to set the intensity to a minimum value at the lower limit of detection.

A substrate inspection device according to yet another aspect of an embodiment of the invention includes a voltage setting section that sets the voltage applied from the voltage apply section.

According to this aspect, because the voltage setting section sets a voltage applied from the voltage apply section, it is possible to set an adequate voltage needed to ensure detection accuracy. For example, when a high degree of inspection accuracy is required, the voltage to be applied is set to a maximum value at the upper limit not to damages on the substrate. Conversely, when damages on the substrate are limited to the least, it is possible to set the voltage to a minimum value at the lower limit of detection.

A substrate inspection device according to still another aspects of an embodiment of the invention includes a voltage apply section which applies the voltage in such a manner that potential at the electrode portion is higher than potential at the second inspection point.

According to this aspect, the voltage apply section applies a voltage in such a manner that potential at the electrode portion is higher than potential at the second inspection point. This enables the electrode portion to trap electrons generated through ablation. Metal ions bearing positive charges generated through laser ablation thereby remain at the first inspection point on the wiring. It is thus possible to suppress damages on the wiring caused by laser ablation.

The above and other features, objects and advantages of the present invention will become more apparent from reading of the following description of a preferred embodiment with reference to the following drawings.

BRIEF DESCRIPTION OF THE DRAWINGS

FIG. 11 is a table showing another example of the relation of the intensity of a laser beam emitted from the laser beam irradiation unit with respect to a current value measured by the ammeter.

DETAILED DESCRIPTION OF THE INVENTION

Figure 1:
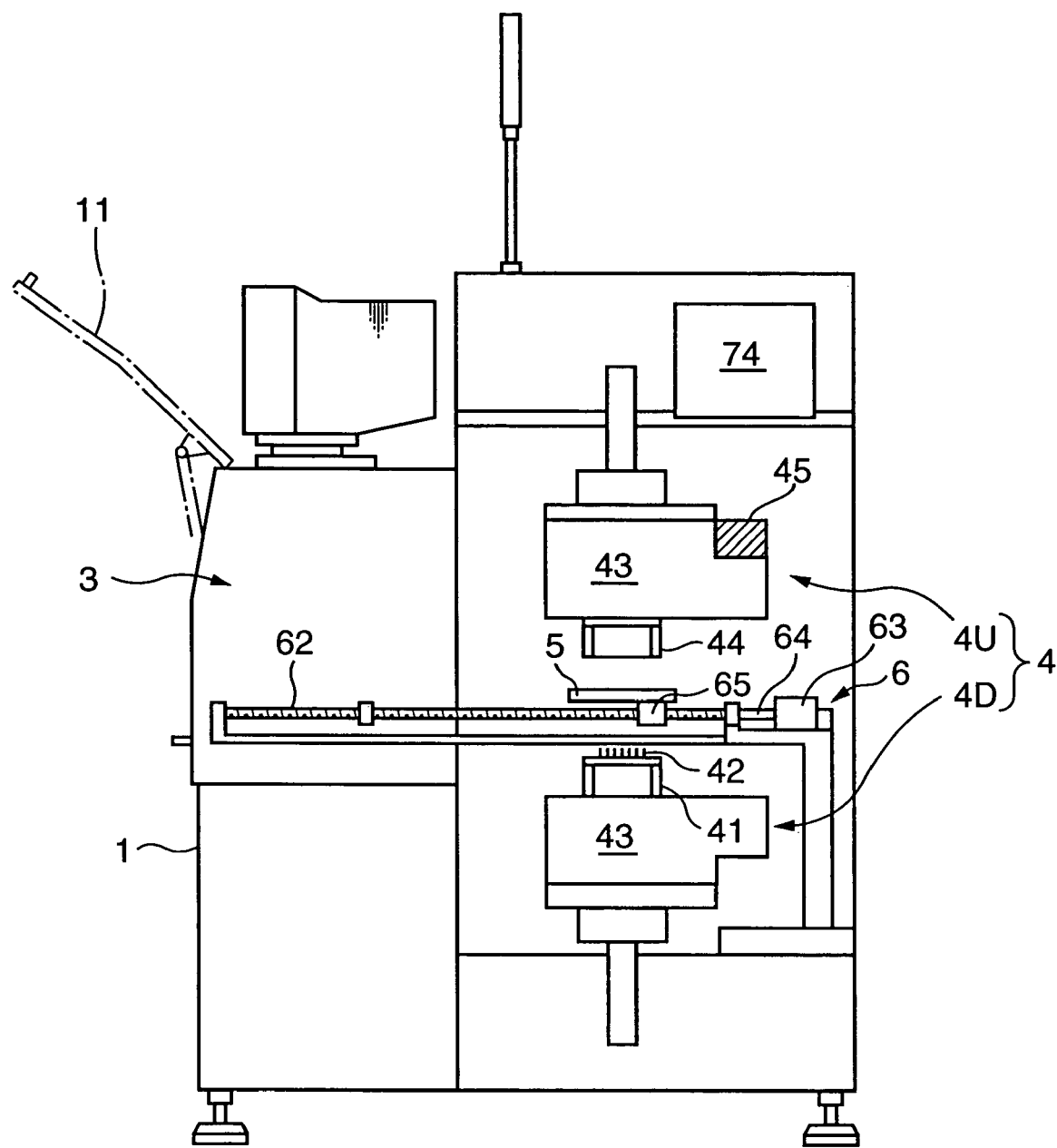
FIG. 1 is a sectional side elevation showing one embodiment of a substrate inspection device according to an embodiment of the invention.
Figure 2:
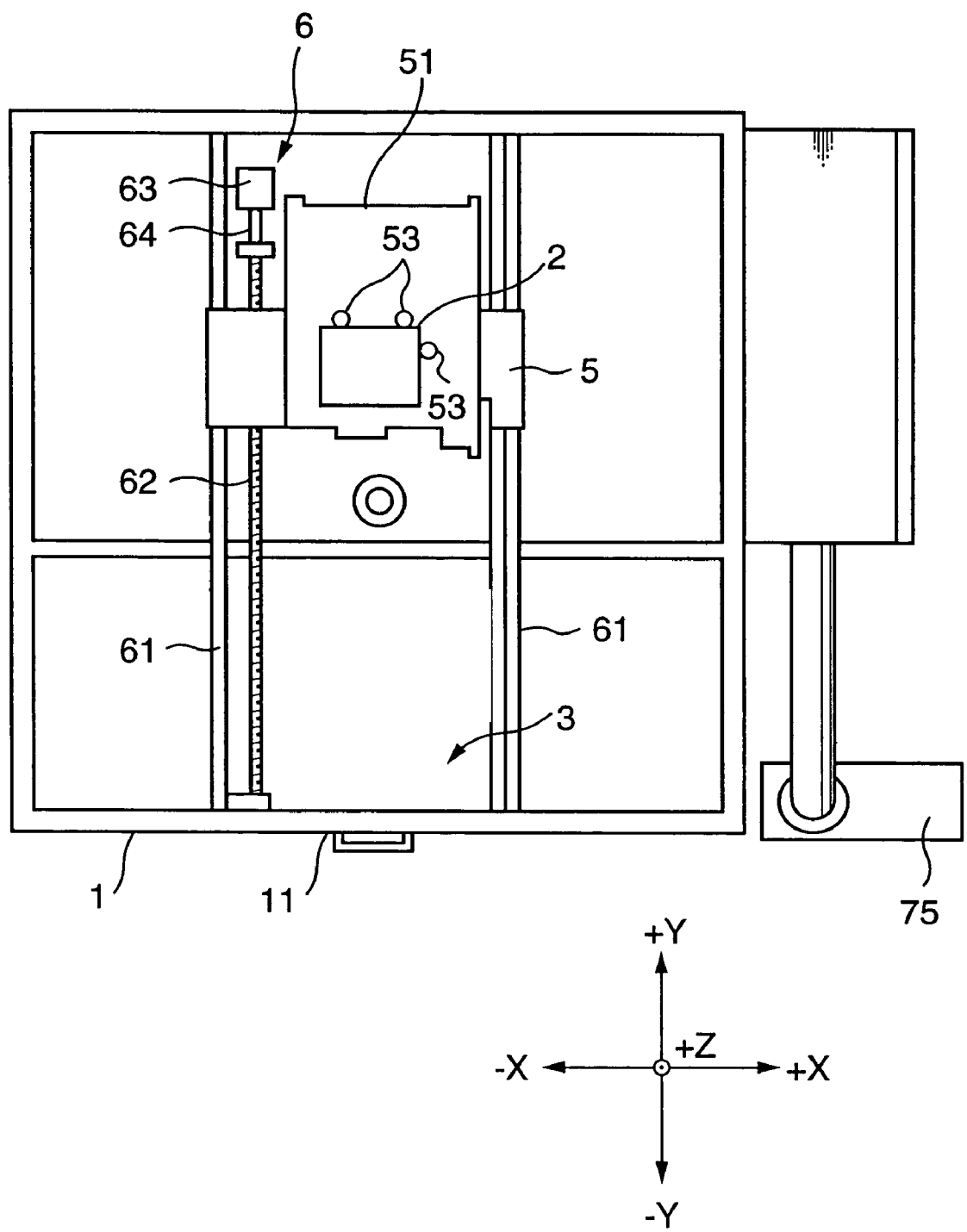
FIG. 2 is a plan view of the substrate inspection device shown in FIG. 1.

FIG. 1 is a sectional side elevation showing one embodiment of a substrate inspection device of the invention. FIG. 2 is a plan view of the substrate inspection device of FIG. 1. In the both drawings, an X-Y-Z rectangular coordinate axes are shown to provide better understanding of the relation between the two drawings in terms of directions.

As shown in these drawings, the substrate inspection device includes a door 11 provided on a device main body 1 to open and close the front side of the device (−Y side). While the door 11 is kept open, a substrate 2 subject to inspection, such as a printed circuit board on which are formed wirings to be inspected, is brought inside the device main body 1 through an take-in-and-out portion 3 provided at the center on the front side of the device. The substrate inspection device also includes plural (for example, 200) contact probes 42, each transmitting an inspection signal, behind (on the +Y side) the take-in-and-out portion 3. The substrate inspection device further includes an inspection portion 4 where an inspection fixture 41 described below moves in such a manner that the contact probes 42 are brought into abutment against the lands (inspection points) of the wirings on the substrate 2.

Furthermore, the substrate inspection device includes a scanner 74 at an appropriate position (herein, at the top inside the device main body 1). The scanner 74 outputs an instruction signal instructing the inspection portion 4 to move the contact probes 42 so that they are brought into abutment against the inspection points and an inspection signal outputted to the inspection points via the contact probes 42, and receives an inspection signal via the inspection portion 4 to determine on the basis of the inspection signal whether the substrate 2 conforms to standards. After the inspection using the inspection portion 4 and the scanner 74 conformity judgment (judgment of defective or non-defective substrate) is completed, the substrate 2 is returned to the take-in-and-out portion 3 and the door 11 is opened for the operator to take the substrate 2 out from the substrate inspection device.

In order to transport the substrate 2 between the take-in-and-out portion 3 and the inspection portion 4, the substrate inspection device is provided with a transportation table 5 that is movable in the Y direction. Also, the transportation table 5 is configured in such a manner that it is moved by a transportation table driving mechanism 6 in the Y direction for positioning. The transportation table driving mechanism 6 comprises two guiding rails 61 extending in the Y direction and spaced part in the X direction at a specific interval, and the transportation table 5 is allowed to slide on these guiding rails 61.

A ball screw 62 is provided in parallel with these guiding rails 61, and one end (−Y side) of the ball screw 62 is axially supported on the device main body 1, and the other end (+Y side) is linked to a rotating shat 64 of a transportation table driving motor 63. Further, the ball screw 62 is threaded into a bracket 65 to which the transportation table 5 is fixed. Hence, when the motor 63 is driven to rotate according to an instruction from a control portion 71 described below (see FIG. 3), the transportation table 5 moves in the Y direction in response to a quantity of rotations and starts to reciprocate between the take-in-and-out portion 3 and the inspection portion 4.

Referring to FIG. 2, the transportation table 5 includes a substrate mounting portion 51 on which the substrate 2 is mounted. The substrate mounting portion 51 holds the substrate 2 mounted thereon in such a manner that the substrate 2 engages three engaging pins 53 while being kept pushed toward the engaging pins 53 by an urging means (not shown) that pushes the substrate 2 from a direction opposing the engaging pins 53. In addition, the substrate mounting portion 51 is formed with an opening (not shown), through which the contact probes 42 provided to a lower inspection unit 4D described below abut on the wirings formed on the bottom surface of the substrate 2 held in the manner described above.

The inspection portion 4 includes, on the upper side (+Z side) of a moving path for the transportation table 5, an upper inspection unit 4U that inspects the wirings by accessing the wirings formed on the top surface of the substrate 2 in a non-contacting manner, and on the lower side (−Z side) of the moving path, the lower inspection unit 4D that inspects the wirings by pressing the contact probes 42 against the wirings formed on the bottom surface of the substrate 2. The inspection units 4U and 4D are arranged almost symmetrical to each other with respect to the moving path for the transportation table 5. The upper inspection unit 4U includes a housing 44 (see FIG. 4) substantially in the shape of a rectangular parallelepiped with its bottom being open, a driving mechanism 43 that drives the housing 44, and a laser beam irradiation unit 45 that emits a laser beam. The lower inspection unit 4D includes the inspection fixture 41 that holds the contact probes 42 in a multi-stylus fashion, and a driving mechanism 43 that drives the inspection fixture 41.

Figure 3:
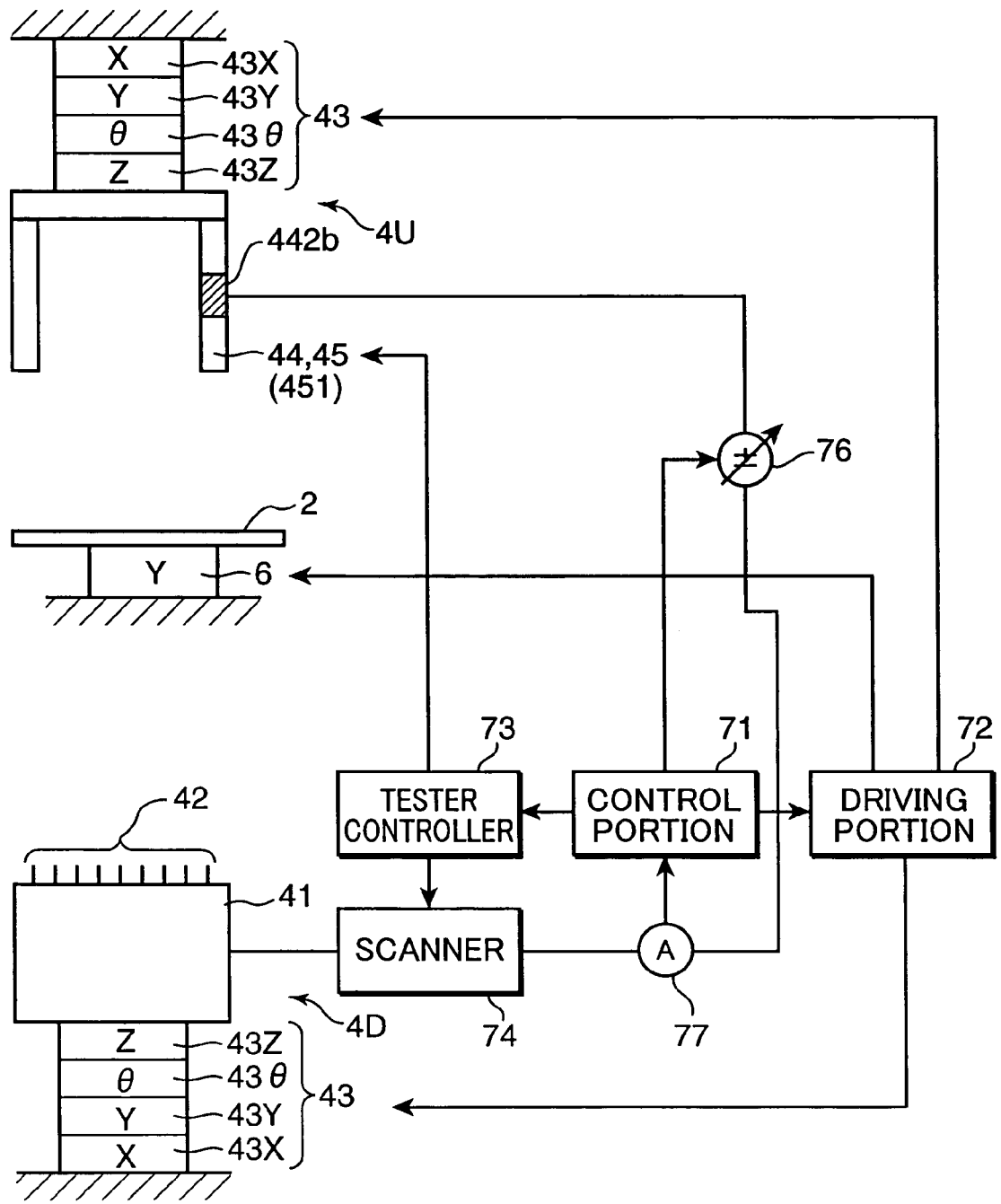
FIG. 3 is a view showing one example of the electric configuration of the substrate inspection device.

FIG. 3 is a view showing an example of the electric configuration of the substrate inspection device. The substrate inspection device includes the control portion 71 that is provided with a CPU, a ROM, a RAM, a motor driver, etc., and controls the entire device by running a program pre-stored in the ROM, a driving portion 72 that outputs a driving instruction to the driving mechanisms 43 and the transportation table driving mechanism 6 upon receipt of an instruction from the control portion 71, a tester controller 73, and the scanner 74.

The tester controller 73 first receives an inspection start instruction from the control portion 71. In accordance with a pre-stored program, the tester controller 73 then selects a contact probe 42 one by one that is in contact with a land positioned at one end of a wiring to be inspected among plural contact probes 42 that are provided on the lower inspection unit 4D and abut the lands on the wirings formed on the bottom surface of the substrate 2. The tester controller 73 also outputs a scan instruction to the scanner 74 and the laser beam irradiation unit 45 (scan portion 452, see FIG. 4) for the inspection to be conducted between the selected single contact probe 42 and the land of the wiring formed on the top surface of the substrate 2 onto which a laser beam from the laser beam irradiation unit 45 is irradiated.

Meanwhile, as is shown in FIG. 3, each driving mechanism 43 includes an X driving portion 43X that moves the inspection fixture 41 (or the housing 44) in the X direction with respect to the device main body 1, a Y driving portion 43Y that is linked to the X driving portion 43X and moves the inspection fixture 41 (or the housing 44) in the Y direction, a θ driving portion 43θ linked to the Y driving portion 43Y and rotates the inspection fixture 41 (or the housing 44) about the Z-axis, and a Z driving portion 43Z that is linked to the θ driving portion 43θ and moves the inspection fixture 41 (or the housing 44) in the Z-direction. The driving mechanism 43 is configured in such a manner that it positions the inspection fixture 41 (or the housing 44) relative to the transportation table 5, and moves the inspection fixture 41 (or the housing 44) up/down in the vertical direction (Z direction) to cause the contact probes 42 (or the housing 44) to abut against or move apart from the wirings formed on the substrate 2 by means of the control portion 71.

First Embodiment

Figure 4:
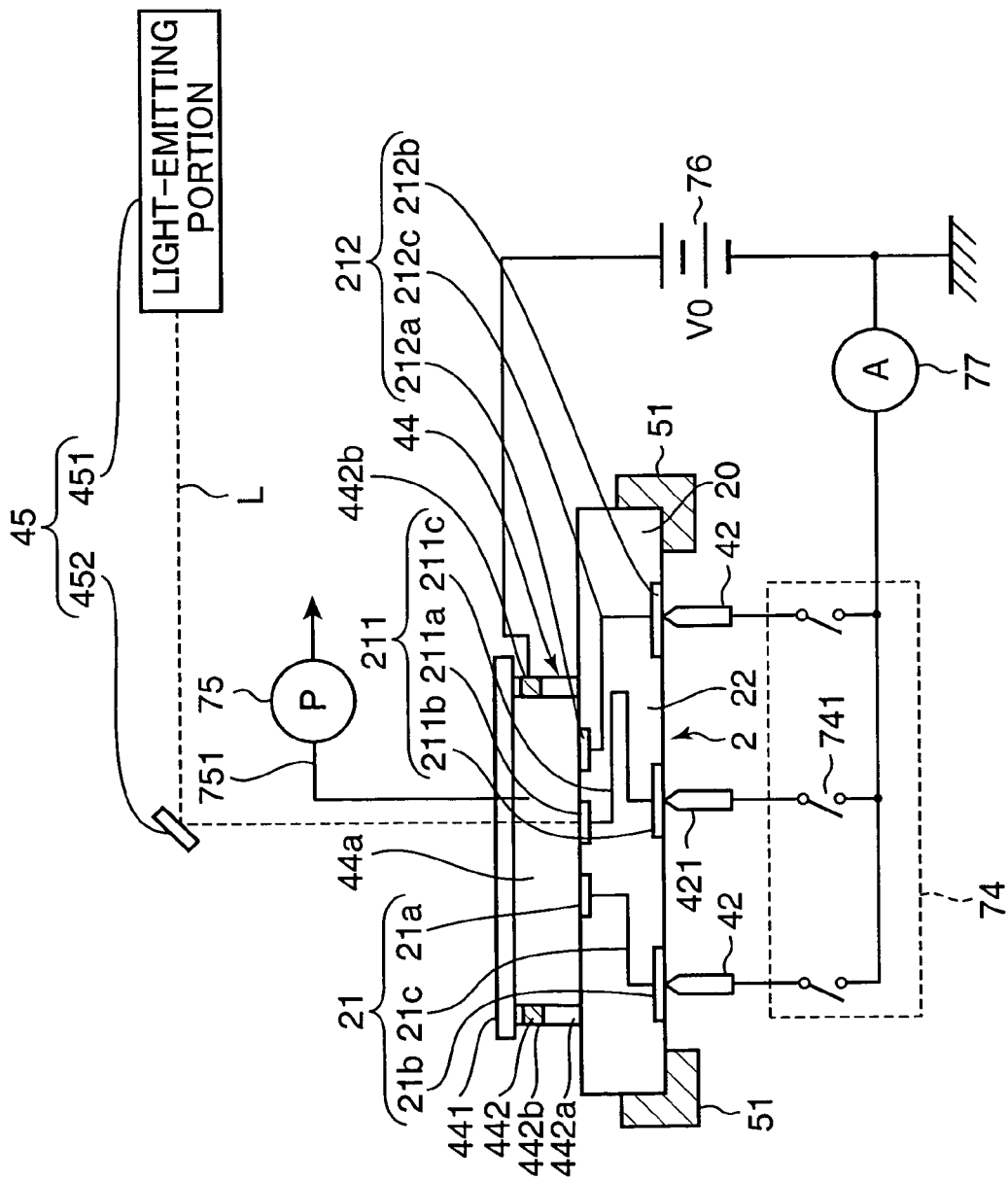
FIG. 4 is a schematic view showing a first embodiment of a major portion in the substrate inspection device.

FIG. 4 is a schematic view showing a first embodiment of the configuration of a major portion of the substrate inspection device. Plural wirings 21, 211, and 212 are formed on a base substrate 20 of the substrate 2. Herein, three wirings are shown for ease of description; however, as is well known in the art, a number of wirings are formed on the top surface or the bottom surface, or in the interior, or on both the top and bottom surfaces and in the interior of the base substrate 20 with the actual substrate 2. The wiring 21 comprises a top surface pattern portion 21a formed on the top surface of the base substrate 20, a bottom surface pattern portion 21b formed on the bottom surface of the base substrate 20, and a via hole portion 21c that is provided in a via hole formed in the base substrate 20 to electrically connect the top surface pattern portion 21a and the bottom surface pattern portion 21b.

A contact probe 42 held in the inspection fixture 41 (not shown) is pressed against the bottom surface pattern portion 21b formed on the bottom surface of the substrate 2, by means of the driving mechanism 43. Each contact probe 42 is connected to one end of one of plural switches 741 that together form the scanner 74. The other end of the switch 741 is connected to a D.C. power supply 76 (a voltage apply section) via an ammeter 77 (a part of a current detection section). The D.C. power supply 76 generates a voltage at a specific value according to an instruction from the control portion 71 (a voltage setting portion 71c and a voltage apply portion 71d described below) (see FIG. 5), and applies the voltage thus generated between the contact probe 42 and an electrode portion 442b formed in the housing 44 via the scanner 74 (see FIG. 3).

Meanwhile, the housing 44 is pressed against the upper surface of the substrate 2 by means of the driving mechanism 43. The housing 44 includes a top wall 441 made of a transparent material (herein, glass), and side walls 442 made of, for example, rubber, and is formed in the shape of a cap to cover a specific region of the top surface of the substrate 2. The electrode portion 442b that traps charged particles (herein, electrons) released from the top surface pattern portion 21a is provided at an appropriate position on the side walls 442. When the housing 44 is pressed against the substrate 2 by means of the driving mechanism 43, the end portion 442a of each side wall 442 abuts against the surface of the substrate 2 and deforms due to pressing. The end portion 442a thereby functions as a packing. This defines an air-tight closed space 44a that is surrounded by the top surface of the substrate 2 and the housing 44. To reduce an internal air pressure of the closed space 44a, a tube 751 connected to a decompression pump 75 (a part of a decompression section) extends through an appropriate position (herein, the top wall 441) of the housing 44 and connected to the closed space 44a.

Further, the upper inspection unit 4U (not shown) is provided with the laser beam irradiation unit 45 that irradiates a laser beam onto an inspection point on the top surface pattern portion 21a of a single wiring 21, which is an object to be inspected among plural wirings 21 formed on the substrate 2. The laser beam irradiation unit 45 includes an light-emitting portion 451 that emits a laser beam L according to an operation instruction from the control portion 71 (a laser beam irradiation portion 71f described below), and a scan portion 452 that directs the laser beam L emitted from the light-emitting portion 451 onto a designated position on the substrate 2 according to an operation instruction from the control portion 71. Herein, the light-emitting portion 451 is configured to emit a laser beam in the UV range having a wavelength $\lambda$ of 266 nm. The light-emitting portion 451 is also configured to emit a laser beam with an intensity (see FIGS. 10 and 11) high enough for laser ablation or two-photon absorption to occur at an inspection point i.e. the irradiated point (a first inspection point) on the top surface pattern portion 21a of the wiring 21.

The light-emitting portion 451 is further configured to be driven by pulses by means of a Q switching element or the like to emit the laser light in pulse forms. In addition, the scanning portion 452 that scans the laser beam L includes a galvanometer mirror to deflect the laser beam in a desired direction. By driving the galvanometer mirror in response to an operation instruction from the control portion 71, a laser beam L emitted from the light-emitting portion 451 is projected swiftly and exactly onto a desired position on the top surface of the substrate 2 (an inspection point set within the top surface pattern portion 21a of the wiring 21 selected by the control portion 71, i.e. the first inspection point).

Moreover, the D.C. power supply 76 is provided, which applies a voltage via the switch 741 of the scanner 74 between the electrode portion 442b provided on the side walls 442 of the housing 44 and the contact probe 42 pressed against the bottom surface pattern portion 21b. The D.C. power supply 76 generates a voltage of a specific value according to an operation instruction from the control portion 71 (the voltage apply portion 71d described below). The D.C. power source 76 applies the voltage in such a manner that potential at the electrode portion 442b provided on the side walls 442 of the housing 44 is higher than the potential at the contact probe 42 pressed against the bottom surface pattern portion 21b.

The ammeter 77 is provided in a conducting path starting from one terminal of the D.C. power supply 76 and returning to the other terminal of the D.C. power supply 76 by way of the electrode portion 442b of the housing 44, the wiring 21 to be inspected (herein, the wiring 211) and the space between the electrode portion 42 and the irradiated inspection point 21a. The ammeter 77 detects a value of a current flowing through the conducing path. To be more specific, the plus terminal of the D.C. power supply 76 is electrically connected to the electrode portion 442b on the housing 44, and the minus terminal of the D.C. power supply 76 is connected to one terminal of the scanner 74 via the ammeter 77. The other terminal of the scanner 74 is connected to plural contact probes 42 provided in correspondence with the bottom surface pattern portions 21b (equivalent to a second inspection point) of the respective wirings 21. The scanner 74 may be a electronic switching device including such as a multiplexer to selectively connect one of the proves to the power supply 76.

A method for conducting an inspection of an open circuit with the use of the substrate inspection device configured as described above will now be described. Initially, a single wiring 211 is selected by means of the switches 741 of the scanner 74 in accordance with a selection instruction from the control portion 71. Because the D.C. power supply 76 is applying a voltage between the top surface pattern 211a of the wiring 211 and the electrode portion 442b, an electric potential or voltage develops between the top surface pattern portion 211a and the electrode portion 442b when the wiring 211 is not in an open state (in a conducting state). When the laser beam irradiation unit 45 irradiates a laser beam L onto the top surface pattern portion 211a of the wiring 211 in response to an operation instruction from the control portion 71 under these conditions, laser ablation occurs on the surface of the top surface pattern portion 211a, thereby making the irradiated portion a plasma state. Charged particles (electrons and metal particles bearing positive charges) are thus generated.

The electrons thus generated are attracted by the electrode portion 442b due to the electric field developed by the D.C. power supply 76. When the wiring 211 is not in an open state (in a conducting state) as has been described, the electrons are released from the surface of the top surface pattern portion 211a which is conductive with the bottom surface pattern portion 211b through the via hole portion 211c. When these electrons reach the electrode portion 442b, an electric current flows through the conducting path from the plus terminal of the D.C. power supply 76 to the minus terminal of the D.C. power supply 76 by way of the electrode portion 442b, the wiring 211, the contact probe 421, the scanner 74 (switch 741), and the ammeter 77, and the ammeter 77 detects this current.

On the other hand, when the wiring 211 is in an open state (for example, when the wiring has a non-conducting point resulted from chipping in the via hole portion 211c), the ammeter 77 detects no current because the conduction path is not formed. It is thus possible to conduct an inspection of the wiring 21 for an open state by checking whether a current detected by the ammeter 77.

A method for conducting an inspection of the wiring 21 for a short-circuit will now be described. Herein, descriptions will be given to an inspection to examine whether the wiring 211 formed at or nearly at the center of the substrate 2 and the wiring 212 formed on the right side portion of the substrate 2 are in a short-circuit state. Initially, the single wiring 211 is selected by means of the switches 741 of the scanner 74 in accordance with a selection instruction from the control portion 71. When the wiring 211 and the wiring 212 are in a short-circuit state, an electric field develops between the top surface portion 212a and the electrode portion 442b via a short-circuited portion. When the laser beam irradiation unit 45 projects a laser beam L onto the top surface pattern portion 212a of the wiring 212 in response to an operation instruction from the control portion 71 under these conditions, laser ablation occurs on the surface of the top surface pattern portion 212a, thereby making the irradiated portion a plasma state. Charged particles (electrons and metal particles bearing positive charges) are thus generated.

The electrons thus generated are attracted by the electrode portion 442b due to the electric field developed by the D.C. power supply 76. When the wiring 211 and the wiring 212 are in a short-circuit state as has described above, the electrons are released from the surface of the top surface pattern portion 212a of the wiring 212 that is in a short-circuit state with the wiring 211. When these electrons reach the electrode portion 442b, a current flows through the conducting path from the plus terminal of the D.C. power supply 76 to the minus terminal of the D.C. power supply 76 by way of the electrode portion 442b, the wiring 212, the wiring 211, the contact probe 421, the scanner 74 (switch 741), and the ammeter 77, and the ammeter 77 detects this current.

On the other hand, when the wiring 211 and the wiring 212 are not in a short-circuit state, the ammeter 77 detects no current because the conducting path described above is not formed. Thus the wiring 21 is inspected for a short-circuit state by checking whether a current flows through the ammeter 77 while a terminal of a wiring is irradiated with another wiring being connected with the electrode portion 442b through the anmeter.

Figure 5:
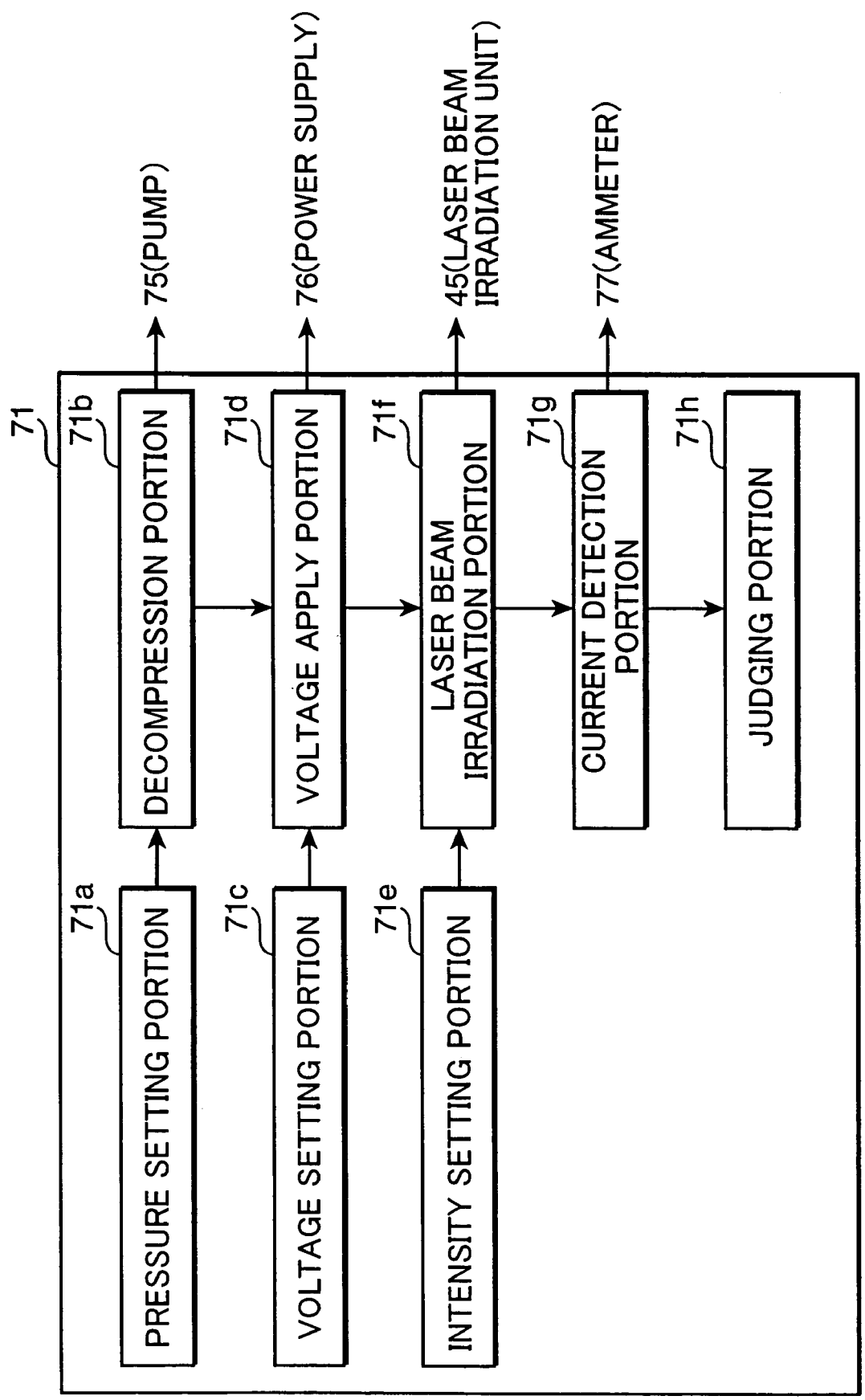
FIG. 5 is a view showing one example of the functional configuration of a control portion.

FIG. 5 is a view showing one example of the functional configuration of the control portion 71. The control portion 71 comprises, for example, a personal computer, and includes: a pressure setting portion 71a that sets an internal air pressure in the closed space 44a defined by the housing 44; a decompression portion 71b that outputs instruction information instructing the decompression pump 75 to reduce the internal pressure of the closed space 44a to the pressure of the value set by the pressure setting portion 71a; a voltage setting portion 71c or a voltage setting section that sets a voltage supplied to the D.C. power supply 76 from a voltage supply portion 71d described below; the voltage supply portion 71d that outputs instruction information instructing the D.C. power supply 76 to generate a D.C. voltage of the voltage value set by the voltage setting portion 71c; an intensity setting portion 71e or an intensity setting section that sets the intensity of a laser beam to be emitted from a laser beam irradiation portion 71f described below; the laser beam irradiation portion 71f (a part of a laser beam irradiation section) that outputs instruction information instructing the laser beam irradiation unit 45 to emit a laser beam of the intensity set by the intensity setting portion 71e; a current detection portion 71g (a part of a current detection section) that receives a detection signal from the ammeter 77 and obtains a current value; and a judging portion 71h that makes a judgment as to a open state and a short-circuit state by checking whether the current value obtained by the current detection portion 71g is larger or smaller than a specific threshold value.

The pressure setting portion 71a sets an internal air pressure of the closed space 44a defined by the housing 44. To be more specific, an internal air pressure of the closed space 44a at the time of inspection is preferably of the order of $10^{-2}$ atmospheres. When the internal pressure is higher than this value, charged particles is not efficiently generated by the laser. The charged particle generation efficiency of charged particles is increased as the internal pressure is lower; however, this in turn extends a time needed to make the internal pressure of the closed space 44a to a desired pressure, resulting in increase of the inspection time. According to an experiment conducted by the inventors, satisfactory charged particle generation efficiency was achieved around a pressure of $10^{-2}$ atmospheres. In addition, the inspection takes a relatively short time with a pressure on this order.

The decompression portion 71b outputs an instruction signal instructing the decompression pump 75 to reduce an internal pressure of the closed space 44a to the pressure set by the pressure setting portion 71a. To be more specific, the decompression portion 71b obtains a measured value of an internal pressure of the closed space 44a at predetermined time intervals (for example, for every second). When the measured pressure is higher than the pressure set by the pressure setting portion 71a, the decompression portion 71b continues decompression operation by means of the decompression pump 75. When the measured pressure is equal to or lower than the pressure set by the pressure setting portion 71a, the decompression portion 71a stops the decompression operation of the decompression pump 75. It is assumed herein that a pressure meter to measure an internal pressure of the closed space 44a is provided in an appropriate position in the housing 44.

The voltage setting portion 71c sets a voltage applied to the D.C. power supply 76 from the voltage supply portion 71d. For example, a voltage V0 supplied to the D.C. power supply 76 is normally set to 200 V, and to 400 V when a measurement at a high degree of accuracy is performed (see FIG. 10). The voltage supply portion 71d outputs instruction information instructing the D.C. power supply 76 to generate a D.C. voltage of a voltage value set by the voltage setting portion 71c.

The intensity setting portion 71e sets the intensity PW of a laser beam to be emitted from the laser beam irradiation portion 71f. For example, the intensity setting portion 71e causes the laser beam irradiation unit 45 to emit a laser beam of the intensity of 40 kW/cm² normally, of the intensity of 60 kW/cm² when a measurement at a high degree of accuracy is performed, and of the intensity of 25 kW/cm² when damages of the wirings are to be avoided to the least (see FIG. 10). The laser beam irradiation portion 71f outputs instruction information instructing the laser beam irradiation unit 45 to emit a laser beam at the intensity set by the intensity setting portion 71e.

The current detection portion 71g receives a detection signal from the ammeter 77 and obtains a current value AM. The judging portion 71h makes a judgment as to an open circuit state and a short-circuit state by checking whether the current value AM obtained in the current detection portion 71g is larger or smaller than a specific threshold value. For example, when the inspection for a short-circuit is conducted, a threshold value SH1 is set to 2 mA, and when the inspection for an open circuit is conducted, a threshold value SH2 is set to 4 mA.

More specifically, in the case of the inspection for a short-circuit, the judging unit 71h judges that wirings under inspection are not short-circuited with each other (conforms to standards) when the current value AM measured by the ammeter 77 is lower than the threshold value SH1, and judges that wirings under inspection are short-circuited with each other (does not conform to standards) when the current value AM is equal to or larger than the threshold value SH1. In the case of the inspection of open circuit, the judging portion 71h judges that a wiring under inspection is conducting (conforms to standards) when the current value AM measured in the ammeter 77 is equal to or larger than then threshold value SH2, and judges that a wiring under inspection is open, i.e. is not conducting (does not conform to standards) when the current value AM is smaller than the threshold value SH2.

Figure 6:
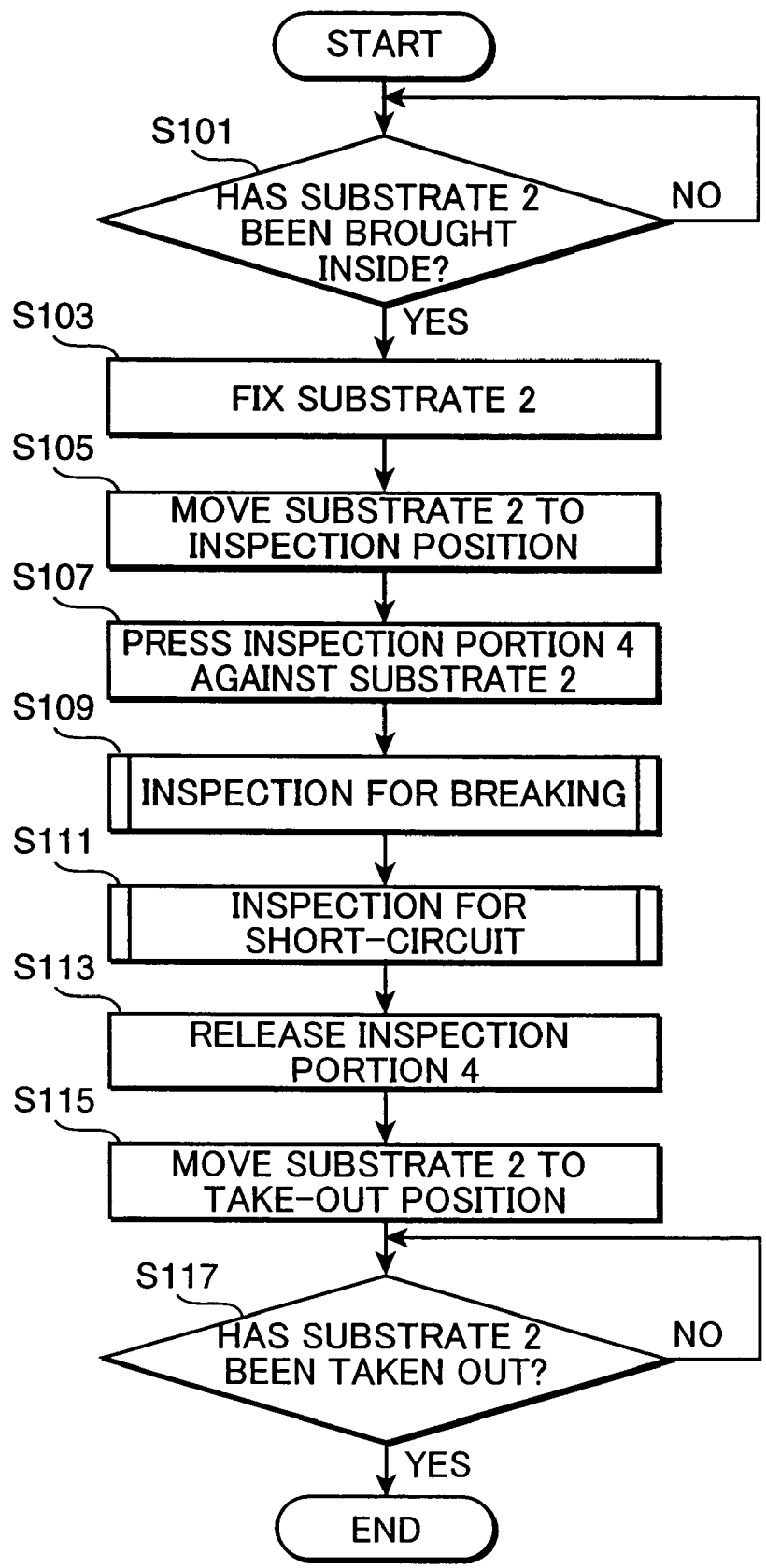
FIG. 6 is a flowchart showing one example of operations of the substrate inspection device.

FIG. 6 is a flowchart showing one example of operations of the substrate inspection device. In the substrate inspection device according to the first embodiment, a substrate 2 to be inspected is placed on the substrate mounting portion 51 located at the position of the take-in-and-out portion 3 by manual operations of the operator (Step S101). The control portion 71 then controls operations of the respective portions forming the substrate inspection device, so that Steps S103 through S117 are performed as follows to inspect the substrate 2.

Initially, the transportation table driving mechanism 6 moves the substrate mounting portion 51 of the transportation table 5 to the inspection position (the position of the inspection portion 4) at which the substrate 2 is inspected, while the substrate 2 is held by the engaging pins 53 of the substrate mounting portion 51 (Step S103). The driving mechanisms 43 then move the inspection units 4U and 4D toward the substrate 2, so that the substrate 2 is pressed from above and below by the inspection units (Step S107). As is shown in FIG. 4, when the lower inspection unit 4D has moved to the substrate 2, the tip ends of the respective contact probes 42 are pressed against the bottom surface pattern portions 21b of the corresponding wirings 21, and are thereby electrically connected to the bottom surface pattern portions 21b. Meanwhile, when the top surface inspection unit 4U has moved to the substrate 2, the closed space 44a, surrounded by the housing 44 and the top surface of the substrate 2, is defined as is shown in FIG. 4.

When the preparation for the inspection of the substrate 2 is completed in this manner, the inspection for open circuit (Step S109) and inspection for short-circuit (Step S111) are conducted. The inspection for the open circuit and the inspection for the short-circuit will be described in detail below with reference to flowcharts of FIGS. 7 and 8, respectively. When the inspections are completed, the lower inspection unit 4D and the upper inspection unit 4U are moved in directions to be spaced apart from the substrate 2, and the pressing of the substrate 2 is released (Step S113). The substrate mounting portion 51 of the transportation table 5 is then moved to the position of the take-in-and-out portion 3, and the substrate 2 is released from the holding by the engaging pins 53 of the substrate mounting portion 51 (Step S115). When it is confirmed that the inspected substrate 2 is taken out from the take-in-and-out portion 3 (YES in Step S117), the flow returns to Step S101, and this processing sequence is repeated.

Figure 7:
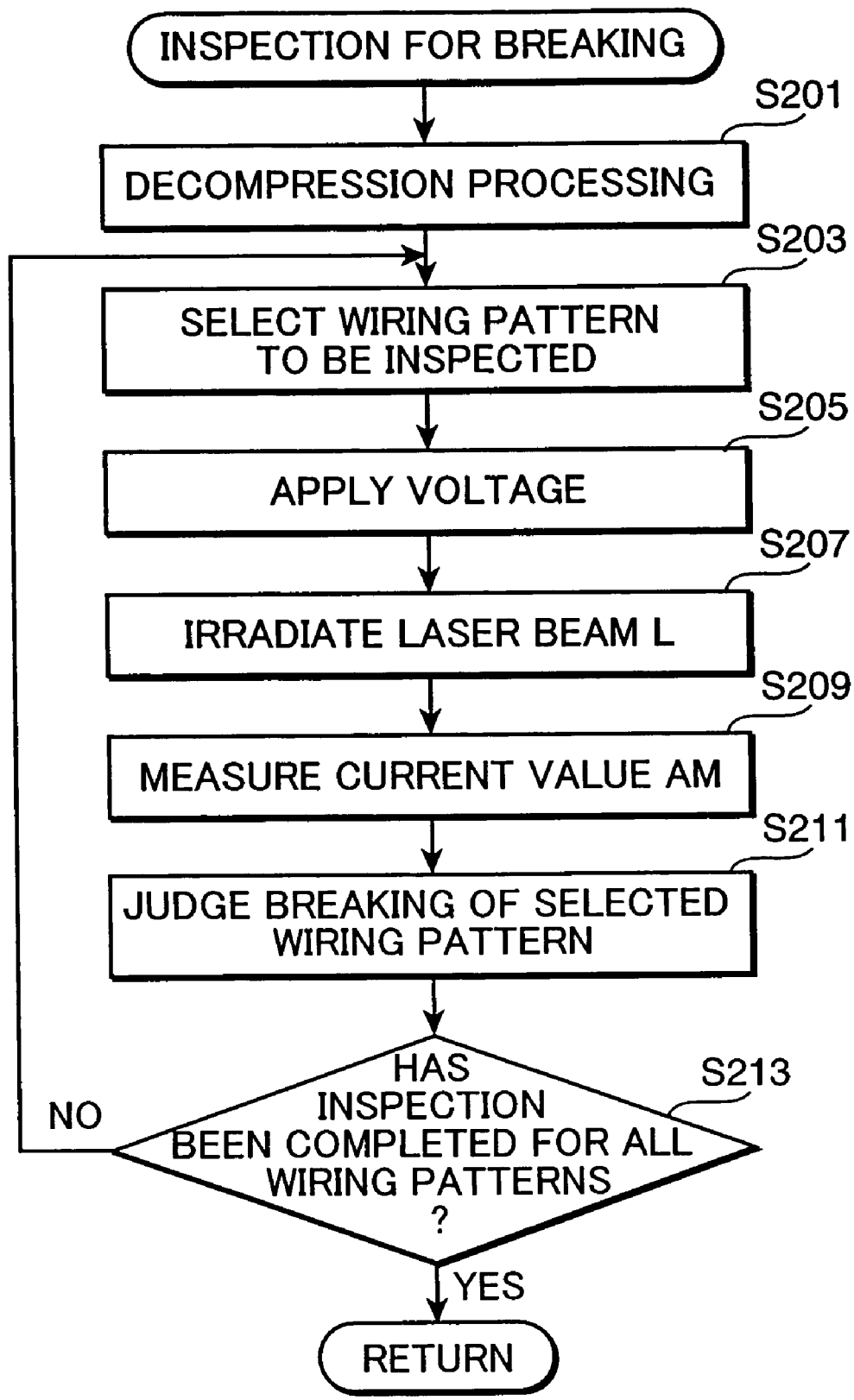
FIG. 7 is a flowchart showing one example of the processing of the inspection of open circuit in Step S109 in the flowchart shown in FIG. 6.

FIG. 7 is a flowchart showing in detail an example of the processing of the inspection for an open circuit in Step S109 in the flowchart shown in FIG. 6. The closed space 44a defined in Step S107 of FIG. 6 is filled with air at an air pressure as high as atmospheric pressure, and when a laser beam is irradiated, for example, to the top surface pattern portion 211a of FIG. 4 inside the closed space 44a in this state, air molecules interfere with electrons generated by the laser ablation and electros are not released from the surface of the top surface pattern potion 211a in a stable manner. This makes it difficult for the ammeter 77 to measure an electric current caused by the electrons. To eliminate this inconvenience, in the first embodiment, the decompression pump 75 is activated to reduce the internal pressure of the housing 44 in response to an operation instruction from the decompression portion 71b, and the decompression processing is continued until the internal pressure of the closed space 44a reaches a pressure on the order of $10^{-2}$ atmospheres (Step S201)

Figure 9:
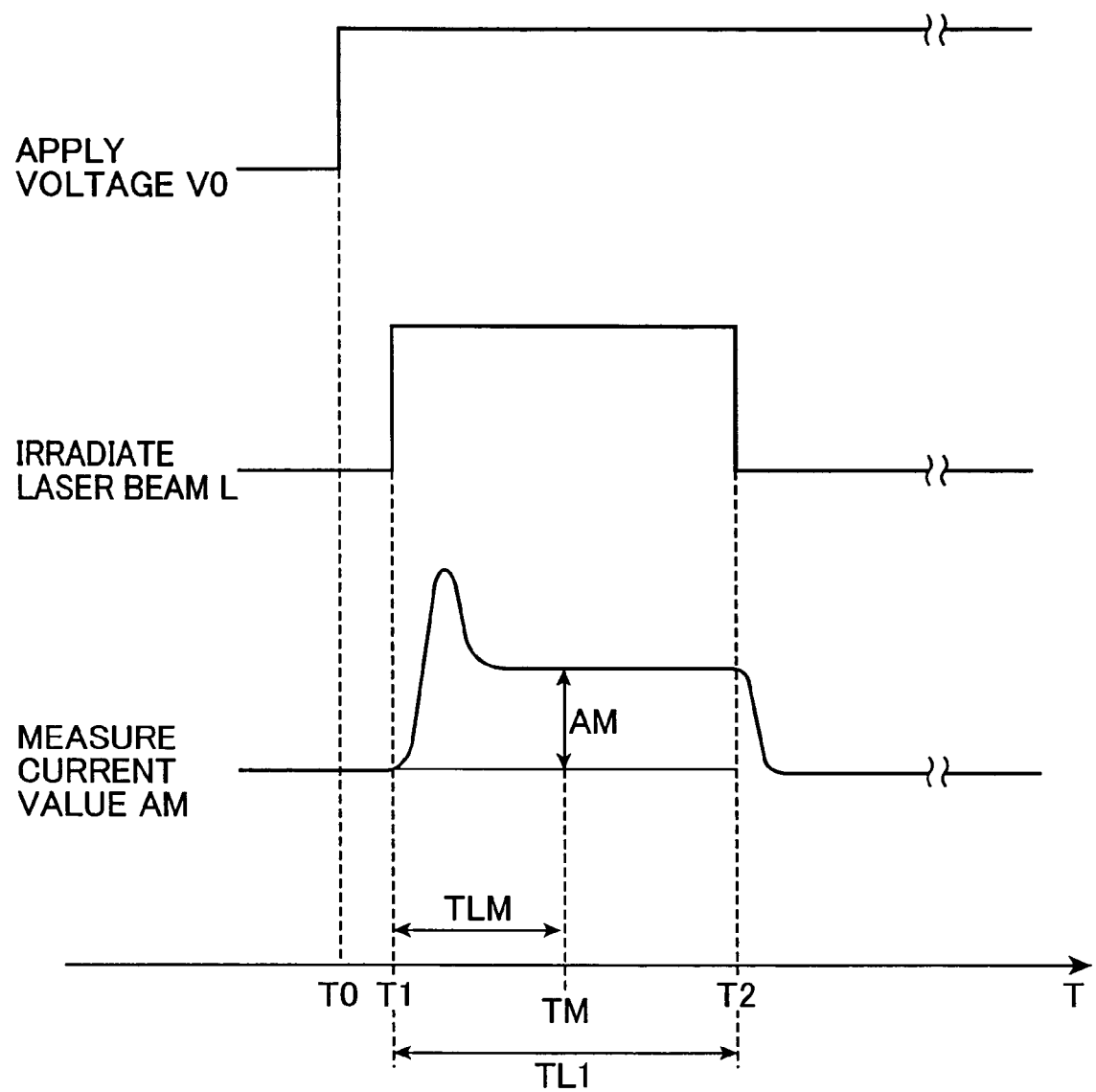
FIG. 9 is a timing chart showing one example of operations in the processing of the inspection for a short-circuit in Step S111 (the processing of the inspection for an open-circuit in Step S109) in the flowchart shown in FIG. 6.

When the decompression processing is completed, the voltage supply portion 71d applies the voltage V0 between the electrode portion 442b of the housing 44 and the wiring 211 at predetermined timing as specified in FIG. 9 (Step S203). An electric potential or voltage develops between the top surface pattern portion 211a and the electrode portion 442b. Electrons generated by the irradiation of a laser beam L are therefore attracted by the electrode portion 442b. This enables the ammeter 77 to measure the current value AM constantly.

After the application of the voltage, the scanner 74 is activated in response to a selection instruction from the control portion 71, and the single wiring 211 selected as an object to be inspected is electrically connected to the minus output terminal of the D.C. power supply 76 (Step S205). When the wiring to be inspected is selected in this manner, the scan portion 452 determines the position to be irradiated on the top surface pattern portion 211a of the wiring 211, and the laser beam irradiation unit 45 irradiates pulses of laser beam L in the UV range in response to an instruction from the laser beam irradiation portion 71f at predetermined timing as specified in FIG. 9 (Step S207).

While a laser beam L is being irradiated, the current detection portion 71g obtains the current value AM (indicated as a measured D.C. current in FIG. 9) from the ammeter 77 (Step S209). The judging portion 71h then compares the current value AM with the threshold value SH1, and judges whether the selected wiring 211 is conducting or open (Step S211). The processing sequence from the selection of the wiring 21 to be inspected (Step S205) to the conduction judgment (Step S211) is repeated until it is judged in Step S213 that all the wirings have been inspected.

Figure 8:
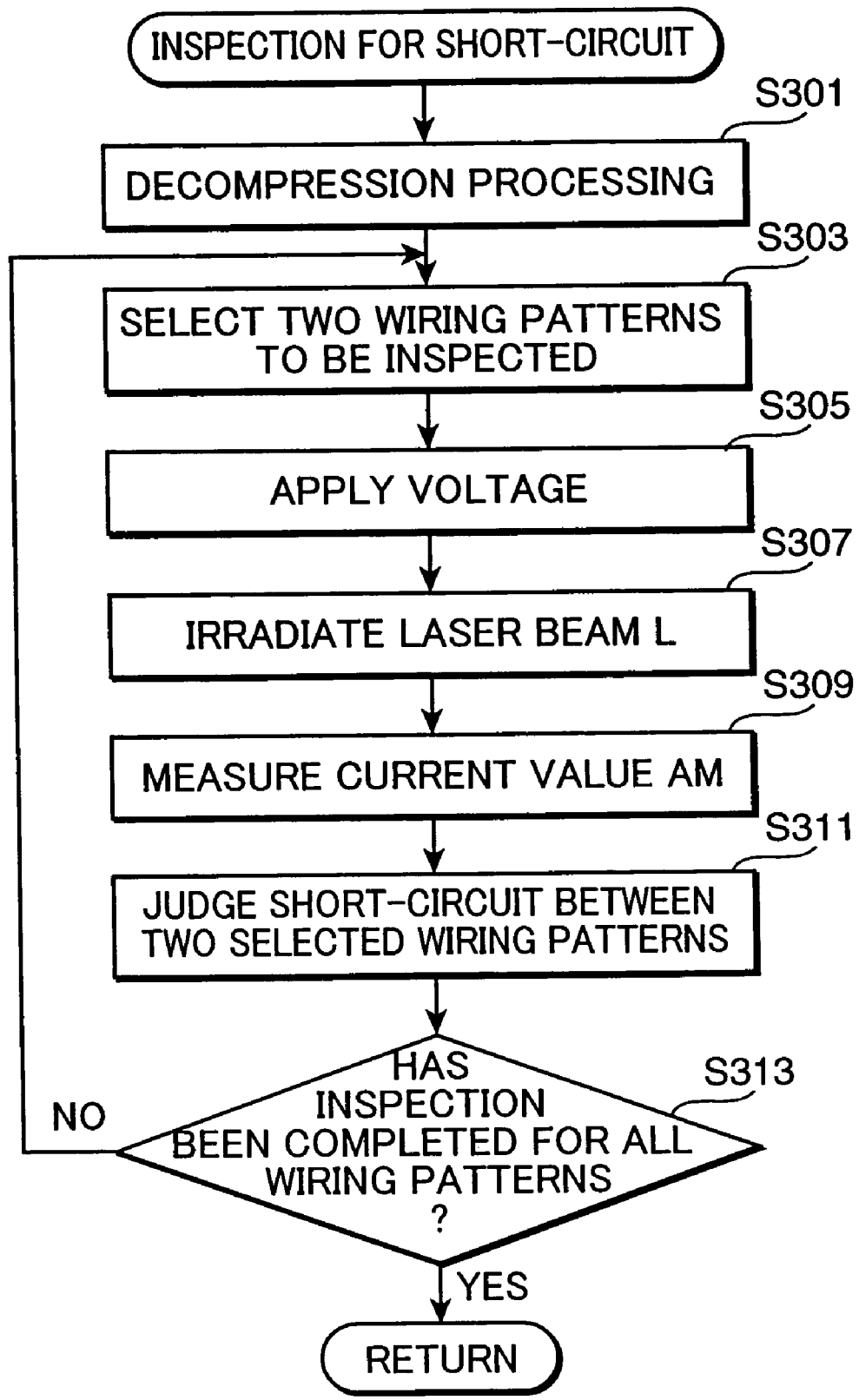
FIG. 8 is a flowchart showing one example of the processing of the inspection for a short-circuit in Step S111 in the flowchart shown in FIG. 6.

FIG. 8 is a flowchart showing in detail one example of the processing of the inspection for a short-circuit in Step S111 in the flowchart shown in FIG. 6. Because the closed space 44a defined in Step S107 of FIG. 6 is filled at first stage with air with an air pressure as high as atmospheric pressure, the decompression pump 75 is activated to reduce an internal pressure of the housing 44 in response to an operation instruction from the decompression portion 71b, and the decompression processing is continued until the internal pressure of the closed space 44a reaches a pressure of the order of $10^{-2}$ atmospheres (Step S301).

When the decompression processing is completed, the scanner 74 and the scan portion 452 are activated in response to a selection instruction from the control portion 71 to select two wirings 211 and 212 as objects to be inspected, and the wiring 211 is electrically connected to the minus output terminal of the D.C. power supply 76 (Step S303). Subsequently, the voltage supply portion 71d applies the voltage V0 between the electrode portion 442b of the housing 44 and the wiring 211 at the predetermined timing as specified in FIG. 9 (Step S305). An electric potential or voltage develops between the top surface pattern portion 212a and the electrode portion 442b. The scan portion 452 then sets the position to be irradiated on the top surface pattern portion 212a of the wiring 212, and the laser beam irradiation unit 45 irradiates pulses of laser beam L in the UV range in response to an instruction from the laser beam irradiation portion 71f at the predetermined timing as specified in FIG. 9 (Step S307).

While the laser beam L is being irradiated, the current detection portion 71g obtains the current value AM (indicated as a measured D.C current in FIG. 9) from the ammeter 77 (Step S309). The judging unit 71h then compares the current value AM with the threshold value SH2, and judges whether the selected wiring 211 and wiring 212 are short-circuited (Step S311). The processing sequence from the selection of wirings 21 to be inspected (Step S303) to the short-circuit judgment (Step S311) is repeated until it is judged in Step S313 that all the combinations or pairs of the wirings have been inspected.

FIG. 9 is a timing chart showing one example of operations in the processing of the inspection for a short-circuit in Step Sill (the processing of the inspection for an open circuit in Step S109) of the flowchart shown in FIG. 6. At a time T0, the voltage V0 is applied between the electrode portion 442b on the housing 44 and the wiring 211. The laser beam irradiation unit 45 then keeps irradiating pulses of laser beam L of the wave length in the UV range onto the top surface pattern portion 211a (212a) of the wiring 211 (212) from a time T1 to a time T2 (during a period TL). The laser ablation phenomenon takes place at the time T1, which enables the ammeter 77 to measure the current value AM. Because a current that starts flowing due to the laser ablation phenomenon needs a certain time until the current value AM thereof is stabilized, the current detection portion 71g obtains the current value AM at a time TM at which a specific time TLM has passed since the time T1.

Figure 10:
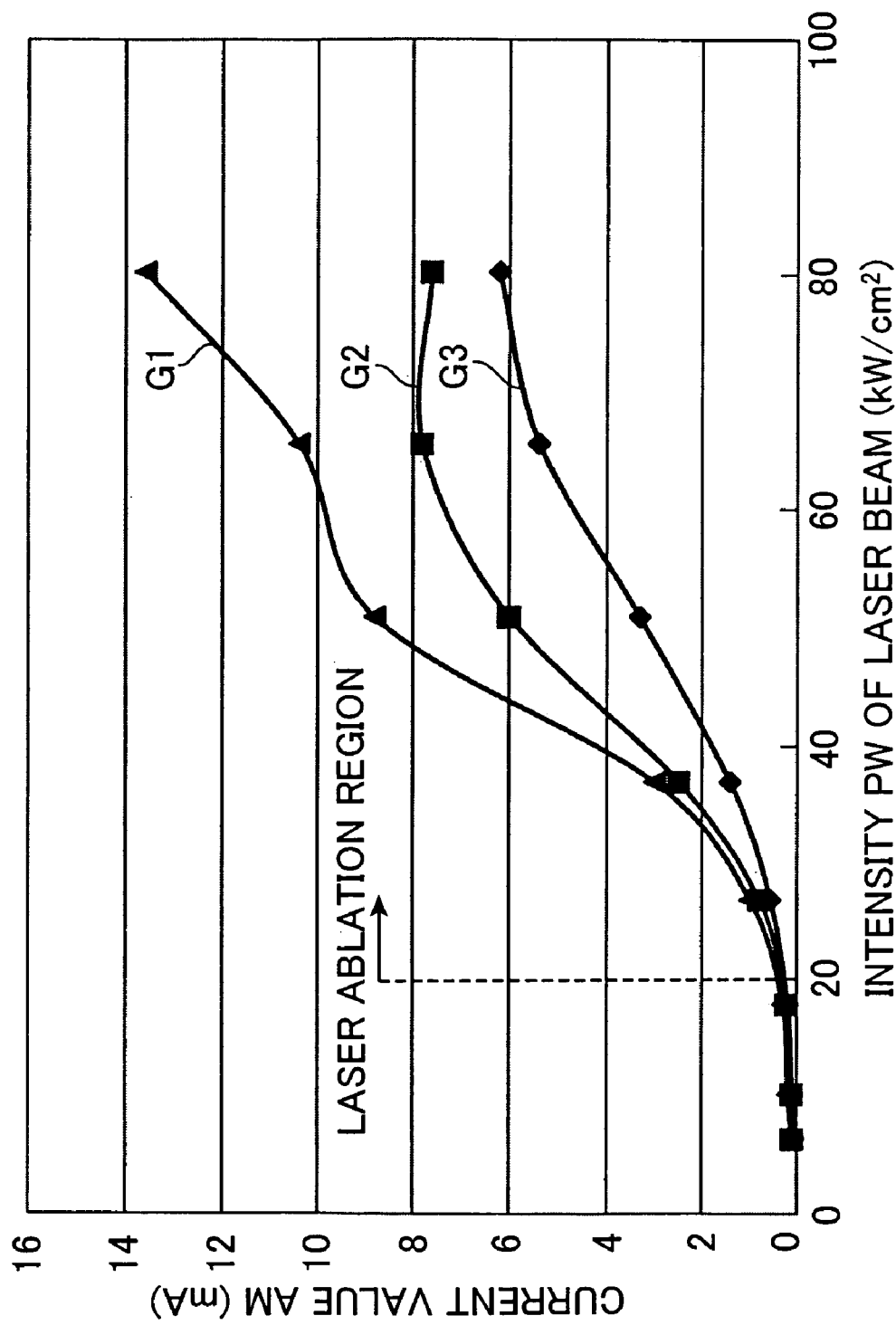
FIG. 10 is a graph showing one example of the relation of the intensity of a laser beam emitted from a laser beam irradiation unit with respect to a current value measured by an ammeter.

FIGS. 10 and 11 are, respectively, a graph and a table showing the relation of the intensity PW of a laser beam emitted from the laser beam irradiation unit 45 with respect to the current value AM measured by the ammeter 77. Referring to FIG. 10, the abscissa represents the intensity PW of a laser beam emitted from the laser beam irradiation unit 45, and the ordinate represents the electric current value AM measured by the ammeter 77. Three lines G1, G2, and G3 represent, respectively, the relations when voltages of 400V, 200V, and 100V are supplied from the D.C. power supply 76 as the voltage V0. Also, FIGS. 10 and 11, shows that the laser ablation phenomenon takes place on the surface of the top surface pattern portion 21a when the intensity PW of a laser beam is 20 kW/cm$^2$ or higher. It should be noted, however, that a so-called two-photon absorption phenomenon (not shown) takes place when the intensity PW of a laser beam is in the vicinity of 20 kW/cm$^2$. In addition, when the light-emitting portion 451 of the laser beam irradiation unit 45 emits a laser beam L having a wavelength λ of 266 nm, a weak current flows due to the photo-electric effect even when the intensity PW of a laser beam is lower than 20 kW/cm$^2$.

As shown in FIGS. 10 and 11, the laser ablation phenomenon (or two-photon phenomenon) takes place on the top surface pattern portion 21a when the intensity PW of a laser beam is 20 kW/cm or higher. The current value AM measured by the ammeter 77 therefore becomes larger as the intensity PW of a laser beam and the voltage V0 applied from the D.C. power supply 76 are increased. Hence, in order to increase the inspection accuracy by increasing the current value AM measured by the ammeter 77, it is sufficient to increase at least one of the intensity PW of a laser beam and the voltage V0 applied from the D.C. power supply 76.

Because an open-circuit state and a short-circuit state are judged using charged particles (herein, electrons) released by the laser ablation (or the two-photon absorption), the wavelength λ of a laser beam L to be irradiated is not so much limited as in the case of photo electric effect. Non-contact inspection of the wiring 21 is available for an opencircuit and a short-circuit thereof without bringing a contact probe into contact with the surface pattern portion 21a.

Because the intensity setting portion 71e sets the intensity PW of the laser beam irradiated from the laser beam irradiation unit 45, the intensity PW can be set to adequate intensity needed for laser ablation (or two-photon absorption) to occur. For example, when a high degree of inspection accuracy is required, the intensity PW of a laser beam L to be irradiated is set to a maximum value at the upper limit of damage negligible range for the device or the substrate 2. Conversely, when damages on the substrate 2 must be avoided to the least, it is possible to set the intensity PW to a minimum value at the lower limit of current detection available range.

Further, because the voltage setting portion 71c sets the voltage VO that the voltage supply portion 71d supplies to the D.C. power supply 76, the voltage V0 can be set to an adequate voltage needed to ensure detection accuracy. For example, when a high degree of inspection accuracy is required, the voltage V0 to be supplied is set to a maximum value at the upper limit of damages negligible range for the device. Conversely, when damages on the device must be avoided to the least, it is possible to set the voltage V0 to a minimum value at the lower limit of detection.

Furthermore, because the D.C. power supply 76 supplies the voltage V0 in such a manner that potential at the electrode 442b is higher than potential at the wiring 21 (the top surface pattern portion 21a), electrons generated by the laser ablation (or two-photon absorption) are trapped in the electrode portion 442b. Metal ions bearing positive charges generated by the laser ablation are thereby left in the top surface pattern portion 21a of the wiring 21. It is thus possible to suppress damages on the wiring 21 caused by laser ablation.

The housing 44 defines the closed space 44a that encloses the top surface pattern portion 21a of the wiring 21, and the decompression portion 71b (decompression pump 75) reduces the internal pressure of the closed space 44a defined by the housing 44. Hence, the top surface pattern portion 21a of the wiring 21 onto which a laser beam L is irradiated is present within a decompressed space. This suppresses scattering of charged particles and electrodes attributed to the presence of air. Charged particles and electrons can be thus trapped in the electrode portion 442b efficiently.

The electrode portion 442b that traps charged particles (herein, electrons) is provided on the side walls 442 of the housing 44, while the top wall 441 of the housing 44 is made of a transparent material (herein, glass). Hence, the laser beam irradiation unit 45 irradiates a laser beam L to the substrate 2 from above the housing 44, allowing the laser beam L to pass through the transparent top wall 441. Because a laser beam L is irradiated to the substrate 2 from above the housing 44, it is easy for the scan portion 452 to determine the position of a laser beam L on the top surface pattern portion 21a comprising a land or the like as an object to which a laser beam L is to be irradiated.

Second Embodiment

Figure 12:
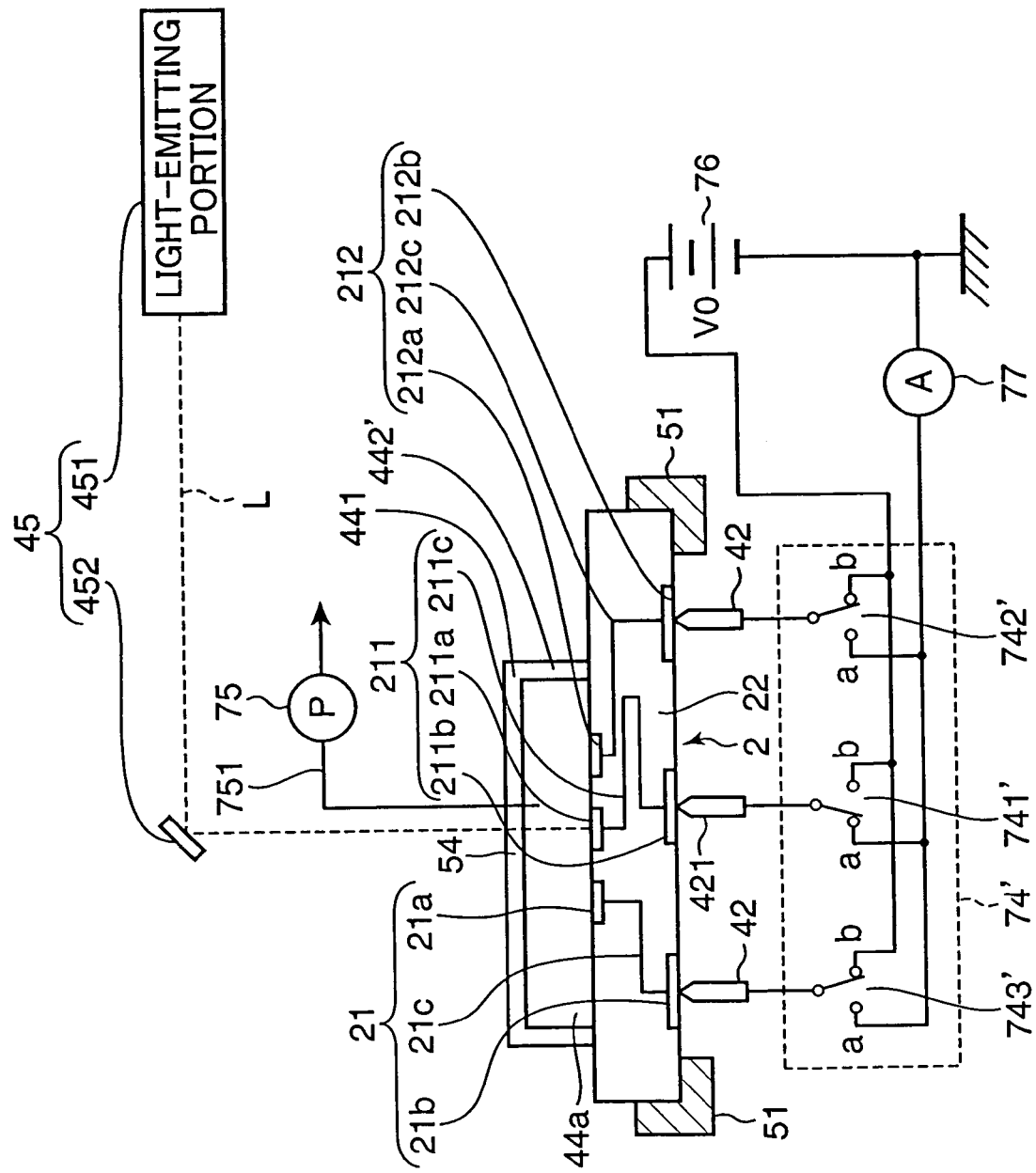
FIG. 12 is a schematic view showing a second embodiment of a major portion of the substrate inspection device.

FIG. 12 is a schematic view showing a second embodiment of the configuration of a major portion of the substrate inspection device. Like components are labeled with like reference numerals as used for the first embodiment shown in FIG. 4, and portions different from the first embodiment will be chiefly described hereinafter. The substrate inspection device according to the second embodiment is not provided with the electrode portion 442b for trapping the discharged particles or the electrons. The substrate inspection device according to this embodiment is configured in such a manner that a voltage V0' is applied between a selected wiring 211 and all or part of the wirings in the vicinity of the selected wiring 211 to efficiently trap electrons released from the wiring 211 onto which a laser beam L is irradiated. In order to achieve this configuration, in the second embodiment, the plus terminal of the D.C. power supply 76' is connected to terminals b of the scanner 74', and the minus terminal of the D.C. power supply 76' is connected to the other terminals a of the scanner 74' via the ammeter 77'.

The driving mechanism 43 presses the housing 44' against the top surface of the substrate 2. The housing 44' includes a top wall 441' made of a transparent material (herein, glass), and side walls 442' made of, for example, rubber, and is formed in the shape of a cap to cover a specific region of the top surface of the substrate 2.

Descriptions will be given to a case as is shown in FIG. 12 where, for example, of the plural switch portions that together form the scanner 74', a switch 741' alone is connected to the terminal a, and the other switches 742' and 743' are connected to the terminals b. In this case, the wiring 211 connected to the switch 741' is selected as an object to be inspected. The D.C. power supply 76' thus applies the predetermined voltage V0' to the wirings 212 and 213 connected to the switches 742' and 743', respectively, and a laser beam L is projected onto the top surface pattern portion 21a.

When the wiring 211 is not in an open circuit state (in a conducting state), an electric potential or voltage develops between the top surface pattern portions 212a and 231a of these wirings 212 and 213, and the top surface pattern portion 211a of the wiring 211 to be inspected because the voltage is applied between the other end portion (the bottom surface pattern portion 211b) of the wiring 211 and the wirings 212 and 213 connected, respectively, to the switches 742' and 743',. Electrons are released from the top surface pattern portion 211a of the wiring 211 to be inspected, by the laser ablation resulted from irradiation of a laser beam L. The released electrons are therefore attracted by the top surface pattern portions 212a and 231a of the wirings 212 and 213 due to the electric potential. Hence, when the wiring 211 to be inspected is not in an open circuit state (in a conducting state), a conducting path is formed from the D.C. power supply 76' and returning to the D.C. power supply 76' by way of the wirings 212 and 213 and the wiring 211 to be inspected. This enables the ammeter 77' to measure the current value AM' of a current flowing through the wiring 211 to be inspected.

On the other hand, when the wiring 211 to be inspected is in an open circuit state (in a non-conducting state) due to disconnection of the wiring or conductor in a via hole, the conducting path is not formed, and the current value AM' detected by the ammeter 77' is 0 (or a value far smaller than the current value AM' when in a non-open circuit state). It is thus possible to judge an open circuit state of the wiring 211 to be inspected at a high degree of accuracy in a stable manner by detecting the value of a current flowing through the wiring 211 to be inspected.

Before the inspection for an open circuit is conducted using the device of the second embodiment as described above, it is necessary to conduct the inspection for a short-circuit among the respective wirings 21 (the bottom surface pattern portions 21b). This is because there is a risk that a current flows in some switching conditions of the scanner 74' when a short-circuit is occurring among the respective bottom surface pattern portions 21b. Various methods have been known to conduct the inspection for a short-circuit from the side of the bottom surface pattern portions 21b, and description of these methods are omitted herein.

As an embodiment of the present invention has been described in the above, the present invention is not limited to the particular structure and operation of the embodiment, but may be varied and modified within the spirit and scope of the invention as will be claimed in the attached claims. For example, the invention may be modified as follows.

(A) The first and second embodiments described a case where the laser beam irradiation unit 45 (light-emitting portion 451) emits a laser beam L in the UV range. However, the laser beam irradiation unit 45 (light-emitting portion 451) may emit a laser beam L in any other range (for example, in the visible light range and infrared range) so far as it causes the laser ablation or the two-photon absorption.

(B) In the first embodiment, the electrode portion 442b is provided on the side walls 442 of the housing 44. However, the electrode portion 442b may be provided on the top wall 441 of the housing 44 with the electrode being transparent or meshed.

(C) The first embodiment described a case where the D.C. power supply 76 applies a voltage in such a manner that potential at the electrode portion 442b is higher than the potential at the contact 42 that is pressed against the bottom surface pattern portion 21b. However, on the contrary to this configuration, the D.C. power supply 76 may apply a voltage in such a manner that potential at the electrode 442b is lower than potential at the contact 42 that is pressed against the bottom surface pattern portion 21b. In this case, metal particles bearing positive charges generated by the laser ablation move to the electrode portion 442b due to a voltage applied from the D.C. power supply 76, and a conduction path is formed as a result.

(D) In the first embodiment, an internal pressure of the air-tight closed space 44a surrounded by the top surface of the substrate 2 and the housing 44 is reduced by means of the decompression pump 75. However, the entire substrate inspection device may be provided in a decompressed space. In this case, the need to define the air-tight closed space 44a using the housing 44 can be eliminated.

This application is based on a Japanese patent application serial No. 2004-209583, filed in the Japan Patent Office on Jul. 16, 2004, the contents of which are hereby incorporated by reference.

What is claimed is:

1. A substrate inspection device that inspects a plurality of wirings formed on a substrate to determine continuity between a first inspection point on a selected wiring and a second inspection point on at least one of the selected wiring and another wiring, the device comprising:
    a laser beam irradiation section that projects a laser beam onto the first inspection point on a wiring with intensity high enough to cause charged particles to be released through one of laser ablation and two-photon absorption;
    an electrode portion that traps the charged particles released from the first inspection point;
    a voltage apply section that applies a voltage of a predetermined magnitude between the electrode portion and the second inspection point; and
    a current detection section that is connected to the voltage apply section in series and detects a value of a current flowing through the wiring under inspection due to the released charged particle.

2. The substrate inspection device according to claim 1, further comprising:
    an intensity setting section that sets intensity of the laser beam to be emitted from the laser beam irradiation section, to a value needed for the laser ablation or two-potion absorption to occur.

3. The substrate inspection device according to claim 2, wherein the intensity setting section sets intensity of the laser beam to a value equal to or larger than 20 kW/cm$^2$.

4. The substrate inspection device according to claim 2, wherein the intensity setting section sets intensity of the laser beam to a value between 20 kW/cm$^2$ and 80 kW/cm$^2$.

5. The substrate inspection device according to claim 1, further comprising:
a voltage setting section that sets the voltage applied by the voltage apply section in accordance with an accuracy of detection.

6. The substrate inspection device according to claim 1, wherein:
the voltage apply section applies the voltage in such a manner that potential at the electrode portion is higher than potential at the second inspection point.

7. The substrate inspection device according to claim 1, further comprising:
a housing that defines a closed space in which the first inspection point is enclosed; and
a decompression section that reduces an internal pressure of the closed space.

8. The substrate inspection device according to claim 7, wherein:
the electrode portion is provided on a side wall of the housing;
the housing has a top wall made of a transparent material; and
the laser beam irradiation section projects the laser beam to the substrate under inspection from above by allowing the laser beam to pass through the transparent top wall.

9. A substrate inspecting method for for inspecting a plurality of wirings formed on a substrate to determine continuity between a first inspection point on a selected wiring and a second inspection point on at least one of the selected wiring and another wiring adjacent to the selected wiring, the method comprising:
projecting a laser beam into the first inspection point on a wiring with intensity high enough ti causee charged particles to be released by one of laser ablation and two-photon absorption;
applying a voltage of a predetermined magnitude between an electrode portion and the second inspectin point;
trapping the charged particles released from the first inspection point using the electroe portion; and
detecting a value of a current flowing through the first inspection point and the second inspection point.

10. A substrate testing apparatus for testing a plurality of wirings formed on a substrate having a top surface and bottom surface, each wiring having a first terminal formed on the top surface and second terminal formed on the bottom surface, the apparatus comprising:
a laser beam irradiator which irradiates a laser beam that discharges electrons by the photoelectric effect onto the first terminal of a selected one of the wirings to discharge electrons from the irradiated terminal, the laser beam having an intensity high enough to cause charged electrons to be released through one of laser ablation and two-photon absorption;
a housing for enclosing at least a part of the top surface;
an electrode disposed on the housing at such a position as to trap the discharged electrons;
a plurality of probes to be brought into contact with the second terminals;
a voltage applier for applying via the probe a voltage between the electrode and the second terminal of at least one of the selected wiring and a wiring adjacent to the selected wiring so that the electrode portion has an electrical potential higher than that of at least one of the second terminal of the selected wiring and the adjacent wiring;
a current detector which detects a current caused by electrons trapped by the electrode and flows through the selected wiring via the electrode; and
a judger which determines existence of at least one of an open-circuit and a short-circuit based on the current detected by the current detector;
a first fixture for supporting the laser beam irradiator and the housing;
a first fixture driver for driving the first fixture between a released position and an operating position where the housing encloses the top surface;
a second fixture for supporting the probes; and
a second fixture driver for driving the second fixture between a released position and an operating position where the probes are in contact with the second terminals.

11. The substrate testing apparatus according to claim 10, wherein the laser beam irradiator includes a deflector which changes the direction of the laser beam in such a manner as to selectively and successively irradiate the first terminals of the plurality of wirings with the laser beam.

12. The substrate testing apparatus according to claim 10, wherein the electrode is provided on the side wall of the housing.

13. The substrate testing apparatus according to claim 10, further comprising a switch means for selectively connecting the probes to the power source.

14. A circuit board testing apparatus for testing a plurality of wirings formed on a circuit board, each wiring having a first terminal and second terminal at opposite ends of each of the wirings, the apparatus comprising:
a laser beam irradiator which irradiates a laser beam onto the first terminal of a selected one of the wirings to discharge electrons from the irradiated terminal by one of laser ablation and two-photon absorption;
an electrode disposed at such a position as to trap the discharged electrons;
a voltage supplier operatively connected between the electrode and the second terminal of the selected wiring to apply voltage therebetween so that the electrode has a higher potential than the second terminal of the selected wiring, the voltage supplier including a probe operatively connected to the voltage supplier and connectable to the second terminal of the selected wiring;
a current detector which detects a current that passes through the electrode, the probe and the second terminal of the selected wiring; and
a judger which determines existence of opencircuit based on the current detected by the current detector.

15. The circuit board testing apparatus according to claim 14, wherein the laser beam irradiator includes a deflector which changes the direction of the laser beam in such a manner as to selectively and successively irradiate the first terminals of the plurality of wirings with the laser beam.

16. The circuit board testing apparatus according to claim 14, wherein the voltage supplier includes a power source, and a connector which electrically connects the power source, the electrode, the probe, the second terminal of the selected wiring, and the current detector with one another to thereby constitute a closed circuit including the space between the electrode and the first terminal of the selected wiring through which the discharged electron flows.

17. The circuit board testing apparatus according to claim 16, wherein the connector includes a plurality of probes which are to be brought into contact with the respective second terminals of the plurality of wirings to establish electrical connection therebetween, and a switch which selectively connects one of the plurality of probes to the power source.

18. The circuit board testing apparatus according to claim 14, wherein the voltage supplier includes a power source having a plus terminal and a minus terminal, and a switch arrangement which connects the selected wiring to the minus terminal of the power source, and at least a part of the unselected wirings to the plus terminal of the power source so that the wirings connected with the plus terminal of the power source serves as the electrode to trap the discharged electrons.

19. The circuit board testing apparatus according to claim 14, wherein the voltage supplier includes a power source having a plus terminal and a minus terminal, and a switch arrangement which connects the selected wiring to the minus terminal of the power source, and all unselected wirings to the plus terminal of the power source so that the wirings connected with the plus terminal of the power source serves as the electrode to trap the discharged electrons.

20. A circuit board testing apparatus for testing continuity and/or short-circuit of wirings formed on a circuit board, each wiring having first and second terminals at opposite ends of the wiring, the apparatus comprising:
 a laser beam irradiator which irradiates the first terminals of the wirings with a laser beam to allow electrons to be discharged from the first terminals by one of laser ablation and two-photon absorption;
 an electrode arranged to trap discharged electrons;
 a voltage supplier including a power source and a probe operatively connected to the power source and connectable to at least one of the second terminals of the wirings, the voltage supplier being operatively connected between the electrode and the at least one of the second terminals to apply voltage therebetween so that the electrode has higher potential than the at least one of the second terminals;
 a current detector which detects an electric current that passes through the electrode, the probe and the at least one of the second terminals; and
 a judger which determines existence of open-circuit and/or short-circuit in the at least one of the wirings based on the current detected by the current detector.

21. A method for testing continuity and/or short-circuit in at least one wiring formed on a circuit board, each wiring having a first and second terminals, the method comprising:
 providing an electrode operatively connected to a probe which is selectively connectable to at least one of the second terminals;
 irradiating at least one of the fist terminals of the wirings with a laser beam to discharge electrons from at least one of the fist terminals into a space by one of laser ablation and two-photon absorption;
 trapping the discharged electrons by the electrode having a potential higher than that at least one of the second terminals of the wiring and allowing a current caused by the trapped electrons to flow through the electrode, the probe and at least one of the second terminals; and
 judging continuity and/or short-circuit in atleast one of the wirings based on the current flowing through the wiring.

* * * * *